Oct. 1, 1968 H. W. VERLINDEN 3,404,354
AMPLITUDE MODULATOR EMPLOYING FORWARD BIASED
UNIDIRECTIONAL CONDUCTING DEVICE
Filed April 25, 1966

Harry W. Verlinden
INVENTOR.

BY [signature]
PATENT AGENT

United States Patent Office 3,404,354
Patented Oct. 1, 1968

3,404,354

AMPLITUDE MODULATOR EMPLOYING FORWARD BIASED UNIDIRECTIONAL CONDUCTING DEVICE

Harry W. Verlinden, Waterloo, Ontario, Canada, assignor to Dominion Electrohome Industries Limited, Kitchener, Ontario, Canada Filed Apr. 25, 1966, Ser. No. 545,067
8 Claims. (Cl. 332—31)

This invention relates to amplitude modulators employing unidirectional conducting devices. More particularly, this invention relates to amplitude modulation circuits that operate at high efficiencies (greater than 50%) and which are capable of modulating up to 100%.

It is known that amplitude modulation can be effected using a circuit employing a reverse-biased diode. In a typical one of such circuits a diode is reversed biased and has its anode connected to a carrier frequency signal source and a modulating signal source, while its cathode is connected to a parallel tuned circuit tuned to the carrier frequency. The efficiency, defined as $$\frac{\text{carrier power out}}{\text{carrier power in}} \times 100$$

(no modulation) of such a modulator is 50% or less.

In accordance with this invention, there is provided an amplitude modulator which employs a unidirectional conducting device, such as a diode, and which produces an efficiency of 50% or greater.

A modulator embodying this invention comprises a first source producing a relatively low frequency signal and a second source producing a relatively high frequency signal to be amplitude modulated by the relatively low frequency signal. A unidirectional conducting device having anode and cathode electrodes, a source of biasing potential, two resistors, and a terminal at a reference potential are connected such that the unidirectional conducting device is biased into conduction in the forward direction with one of the resistors being connected between the source of biasing potential and one electrode of the unidirectional conducting device and the other resistor being connected between the other electrode of the unidirectional conducting device and the aforementioned terminal. The first and second sources are connected to apply their signals to the unidirectional conducting device for passage of the relatively low frequency signal and a part of the relatively high frequency signal through the unidirectional conducting device and development of an amplitude modulated signal across one of the resistors. One-half the peak to peak amplitude of the relatively high frequency signal applied to the unidirectional conducting device must be greater than the absolute value of the biasing potential applied to the unidirectional conducting device, and one-half the peak to peak amplitude of the former signal less the absolute value of the biasing potential applied to the unidirectional conducting device must be greater than one-half the peak to peak amplitude of the relatively low frequency signal applied to the unidirectional conducting device.

This invention will become more apparent from the following detailed description, taken in conjunction with the appended drawings, in which.

Figure 1:
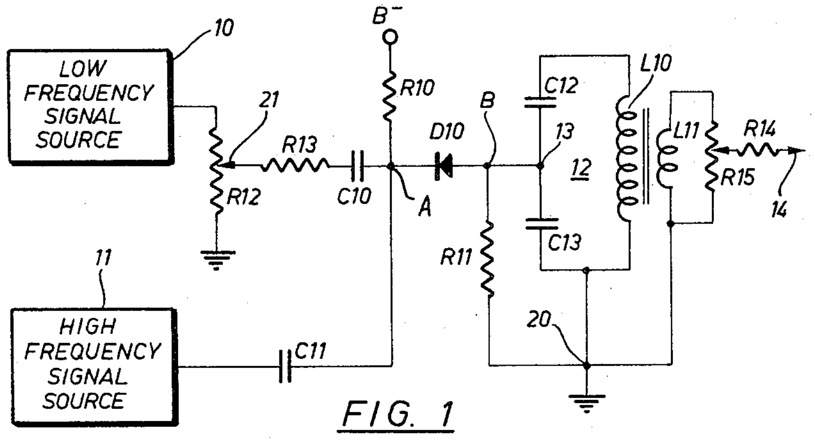
FIGURE 1 is a circuit diagram showing one amplitude modulator embodying this invention.

Referring to FIGURE 1, there is shown a low frequency signal source 10 that may produce an audio frequency signal, for example. There also is provided a high frequency signal source 11 which may produce an R.F. signal, for example. In any event, the frequency of the signal produced by source 11 is relatively high compared to the frequency of the signal produced by source 10, and it is desired to amplitude modulate the former signal by the latter.

A unidirectional conducting device such as a diode D10 has its cathode connected via a resistor R10 to a source of biasing potential, B−. A resistor R11 having a resistance substantially greater than the forward resistance of diode D10 and substantially less than the reverse resistance of diode D10 is connected between the anode of diode D10 and a terminal 20 at a reference potential which, in the present case is ground potential. Alternatively, if the source of biasing potential is B+, it should be connected via resistor R10 to the anode of diode D10, and resistor R11 then would be connected between the cathode of diode D10 and terminal 20. Resistor R11 in the circuit of FIGURE 1 provides isolation and a D.C. path to ground for current from the B− or B+ source. Thus it will be seen that diode D10 is biased into conduction in the forward direction.

The output signal from source 10 is applied to a potentiometer R12 connected between source 10 and ground and having a slider 21. By varying the position of slider 21, one can control the level of the low frequency or modulating signal supplied to the cathode of diode D10 via a series connected isolation resistor R13 and blocking capacitor C10.

The output signal from source 11 is coupled to the cathode of diode D10 via a blocking capacitor C11.

A parallel tuned circuit 12 tuned to the frequency of the output signal from source 11 may be provided. In the circuit of FIGURE 1 it consists of a coil L10 and two capacitors C12 and C13 having a common terminal 13. The anode of diode D10 is connected to terminal 13 so as to enable the amplitude modulated signal developed across resistor R11 to be supplied to tuned circuit 12. The common terminal 20 of capacitor C13 and coil L10 is grounded.

An amplitude modulated signal of conventional form is obtained at output terminal 14, being supplied thereto via a resistor R14, a potentiometer R15 and a coil L11 coupled with coil L10. The position of the slider of potentiometer R15 may be varied to permit the level of the amplitude modulated output signal to be varied. As shown, potentiometer R15 is connected across coil L11, and one common terminal of these components is grounded. Resistor R14 is connected between the slider of potentiometer R15 and output terminal 14.

Figures 2, 3:
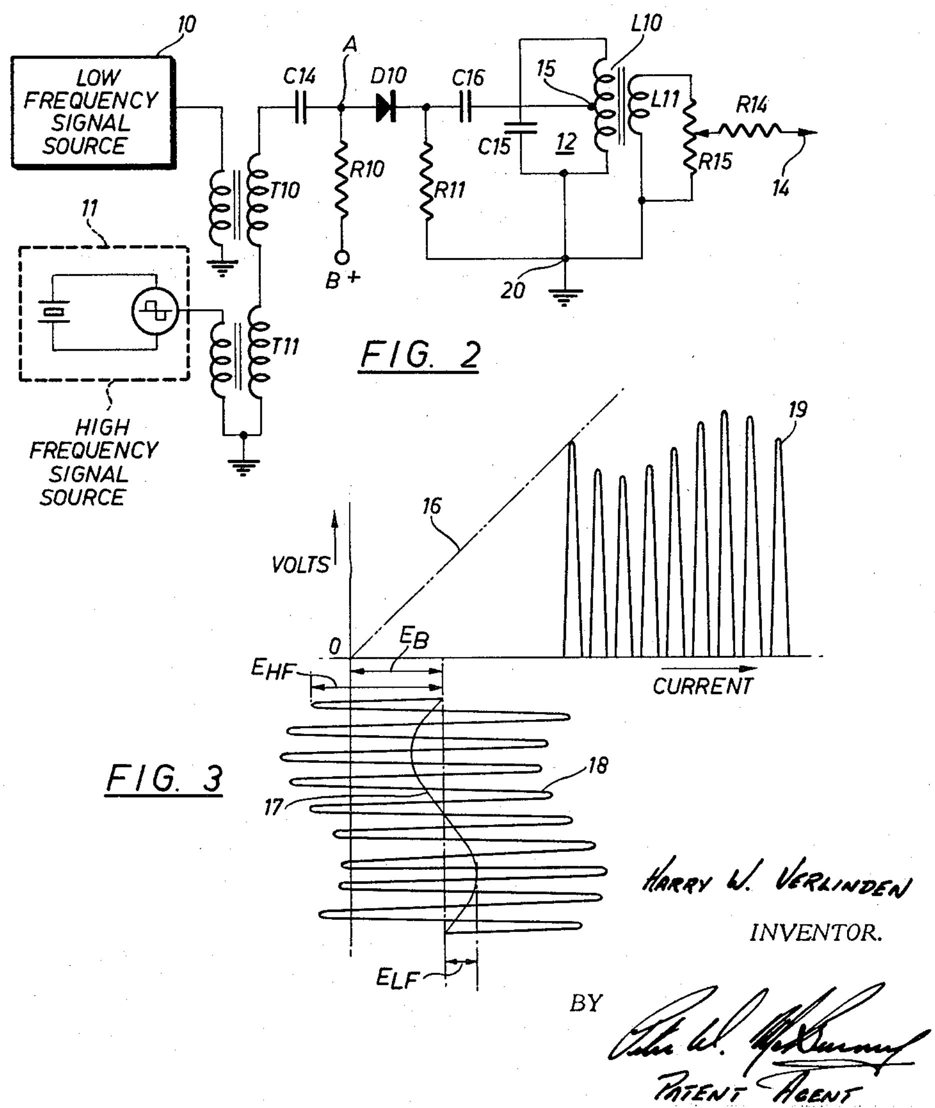
FIGURE 2 is another circuit diagram showing a modified form of amplitude modulator embodying this invention.
FIGURE 3 is a graph illustrating the operation of the modulator shown in FIGURE 1.

The modulator of FIGURE 2 differs from that shown in FIGURE 1 in that the signals from sources 10 and 11 are supplied to diode D10 via transformers T10 and T11 and a blocking capacitor C14, the secondary windings of transformers T10 and T11 and capacitor C14 being connected in series circuit between ground and the anode of diode D10. In addition, the polarity of diode D10 has been reversed, as has been the polarity of the biasing potential source, so that B+ is connected to the anode of diode D10 via resistor R10. Diode D10 still is forward biased, however. If B− is employed, resistor R10 should be connected between B− and the cathode of diode D10, while resistor R11 then would be connected between the anode of diode D10 and ground. Tuned circuit 12 of FIGURE 2 differs from the tuned circuit of FIGURE 1 in that it employs a single capacitor C15 and a coil L10 that has a tap 15. The cathode of diode D10 is connected to tap 15 via a blocking capacitor C16 which should present a high impedance to the low frequency signal.

In the circuit of FIGURE 2, source 11 is shown as being a crystal controlled square wave oscillator, but this is merely by way of example.

The operation of the circuit of FIGURE 1 can best be explained by reference to FIGURE 3 in which the relatively straight line 16 schematically designates the linear part of the characteristic curve of diode D10. $E_B$ designates the D.C. forward bias voltage applied to diode D10, i.e., the D.C. bias voltage at point A in FIGURE 1. This differs from B− by the voltage drop across resistor R10. The relatively low frequency or modulating signal derived from source 10 and applied to the diode, i.e., this signal at point A is shown at 17, and one-half of its peak to peak amplitude is designated $E_{LF}$. The relatively high frequency or carrier frequency signal derived from source 11 and obtained at point A is not shown in FIGURE 3, but it is a sinusoidal signal of constant amplitude having a peak to peak voltage of $2E_{HF}$. The composite signal obtained at point A is shown at 18. The amplitude modulated signal obtained at point B (FIGURE 1) is shown at 19 and is the carrier frequency signal at point A amplitude modulated by the modulating signal at point A.

It should be noted that it is essential to the present invention that diode D10 be forward biased and that the following relationships be maintained:

$$E_{HF} > |E_B| \quad (1)$$

$$E_{HF} - |E_B| > E_{LF} \quad (2)$$

If these conditions are observed, the efficiency of the modulator of FIGURES 1 and 2 will be 50% or greater. It also should be noted that with $E_B=0$, 100% modulation can be obtained.

It will be seen from the foregoing that the modulating signal in effect varies the bias on diode D10, which then passes a greater or lesser amount of the signal being modulated in accordance with the instantaneous value of the modulating signal. Since diode D10 is forward biased, then, when there is no modulating signal, at least 50% of the higher frequency signal at point A passes through the diode, and with $E_B$ other than zero and forward biasing diode D10, more than 50% of the higher frequency signal at point A passes through the diode. With $E_B=E_{HF}$, 100% of the higher frequency signal would pass through diode D10, but this is contrary to Equation 1, and no modulation could be obtained under these circumstances.

The operation of the circuit shown in FIGURE 2 is the same as the operation of the circuit of FIGURE 1 except that waveforms 18 and 19 would be rectangular rather than sinusoidal.

It should be noted that high level input signals may be used with circuits embodying this invention, and by appropriate choice of $E_B$ it can be ensured that the operation is being carried out on the linear part of the diode characteristic, thus making the modulation operation essentially independent of the diode characteristic. Naturally high level output signals can be obtained.

While modulators embodying this invention have many obvious uses, they are particularly suited for providing audio modulated signals in the broadcast frequency range to serve as marker signals for receiver alignment. When so used, a number of circuits the same as FIGURE 1 may be provided. Sources 11 would be crystal controlled square wave oscillators each operating at a different frequency. Each output terminal 14 would be connected to a common RF amplifier.

A circuit of the type shown in FIGURE 1 has been operated successfully using a modulating signal in the audio frequency range, $B^- = -12$ volts, and a square wave carrier in the range of 262.5 to 1605 kc. The following components were used in this circuit.

| | |
|---|---|
| R10 | 15–22K |
| R11 | 10–12K |
| R12 | 20K |
| R13 | 3.3K |
| R14 | 1K |
| R15 | 1K |
| C12 ____pf__ | 36 |
| C13 ____pf__ | 100 |
| Diode D10 | 1N87a |
| Turns ratio L10/L11 | 10 or 20:1 |

The embodiments of the invention in which an exclusive property or privilege is claimed are defined as follows:

1. A modulator comprising a first source producing a relatively low frequency signal; a second source producing a relatively high frequency signal to be amplitude modulated by said relatively low frequency signal; a unidirectional conducting device having anode and cathode electrodes; a source of biasing potential; a terminal at a reference potential; first and second resistors; said source of biasing potential, said resistors, said terminal and said unidirectional conducting device being connected in a circuit such that said unidirectional device is biased into conduction in the forward direction with one of said resistors being connected between said source of biasing potential and one of said electrodes of said unidirectional conducting device, and the other of said resistors being connected between the other of said electrodes of said unidirectional conducting device and said terminal; and means connecting said first and second sources to the same one of said electrodes of said unidirectional conducting device for applying said relatively low frequency signal and said relatively high frequency signal to said unidirectional conducting device for passage of said relatively low frequency signal and a part of said relatively high frequency signal through said unidirectional conducting device and development of an amplitude modulated signal across one of said resistors; one-half the peak to peak amplitude of said relatively high frequency signal applied to said unidirectional conducting device being greater than the absolute value of said biasing potential applied to said unidirectional conducting device and one-half the peak to peak amplitude of said relatively high frequency signal applied to said unidirectional conducting device less the absolute value of said biasing potential applied to said unidirectional conducting device being greater than one-half the peak to peak amplitude of said relatively low frequency signal applied to said unidirectional conducting device.

2. A modulator according to claim 1 wherein said other resistor is connected between said anode and said terminal, said first and second sources are connected to said cathode, said source of biasing potential is connected to said cathode, and said biasing potential is negative relative to said reference potential.

3. A modulator according to claim 1 wherein said other resistor is connected between said cathode and said terminal, said first and second sources are connected to said anode, said source of biasing potential is connected to said anode, and wherein said biasing potential is positive relative to said reference potential.

4. A modulator according to claim 1 including a parallel tuned circuit tuned to the frequency of said relatively high frequency signal, said unidirectional conducting device being connected to said tuned circuit for supplying said amplitude modulated signal developed across the resistor to said tuned circuit.

5. A modulator according to claim 4 wherein said parallel tuned circuit comprises a coil and two capacitors having a common terminal, said unidirectional conducting device being connected to said common terminal.

6. A modulator according to claim 4 wherein said parallel tuned circuit comprises a capacitor and a coil having a tap, said unidirectional conducting device being connected to said tap.

7. A modulator according to claim 2 including a parallel tuned circuit tuned to the frequency of said relatively high frequency signal, said anode being connected to said tuned circuit for supplying said amplitude modulated signal developed across the resistor to said tuned circuit.

8. A modulator according to claim 3 including a parallel tuned circuit tuned to the frequency of said relatively high frequency signal, said cathode being connected to said tuned circuit for supplying said amplitude modulated signal developed across the resistor to said tuned circuit.

References Cited

UNITED STATES PATENTS

| | | | |
|---|---|---|---|
| 2,771,584 | 11/1956 | Thomas | 332—29 |
| 2,917,717 | 12/1959 | Thorsén | 307—317 X |

FOREIGN PATENTS

| | | |
|---|---|---|
| 879,953 | 10/1961 | Great Britain. |

ALFRED L. BRODY, *Primary Examiner.*